United States Patent [19]
Liu et al.

[11] Patent Number: 5,278,874
[45] Date of Patent: Jan. 11, 1994

[54] PHASE LOCK LOOP FREQUENCY CORRECTION CIRCUIT

[75] Inventors: Clif Liu, San Diego, Calif.; Kevin L. Kloker, Arlington Heights; Thomas L. Wernimont, Palatine, both of Ill.

[73] Assignee: Motorola, Inc., Schaumburg, Ill.

[21] Appl. No.: 939,745

[22] Filed: Sep. 2, 1992

[51] Int. Cl.$^5$ .............................................. H03D 3/24
[52] U.S. Cl. ..................................... 375/120; 331/11; 331/23
[58] Field of Search ........................... 375/81, 118-120; 328/115; 331/1 R, 1 A, 10-11, 17, 23, 25

[56] References Cited

U.S. PATENT DOCUMENTS 4,590,602  5/1986  Wolaver .............................. 375/120

OTHER PUBLICATIONS

"MECL Device Data" Rev. 4 published by Motorola, Inc. in 1989, pp. 6-20 to 6-34.

Primary Examiner—Curtis Kuntz
Assistant Examiner—Young Tse
Attorney, Agent, or Firm—Elizabeth A. Apperley

[57] ABSTRACT

A phase lock loop circuit (10) which locks to a frequency within a range of input signal frequencies. A frequency discriminator (12) of phase lock loop circuit (10) determines a maximum pulse width of the input signal by counting a number of pulses of a reference signal in each of a series of pulses of the input signal. A coarse frequency controller (16) compares the maximum pulse width to two threshold values to determine whether the reference signal should be coarsely or finely adjusted. If the reference signal is coarsely adjusted, control circuit (16) provides a coarse frequency control signal to indicate whether a voltage controlled oscillator, VCO, (26) should increase or decrease the reference frequency. If the reference frequency is finely adjusted, a phase discriminator (22) provides a fine frequency control signal to the VCO to either increase or decrease the frequency of the reference signal with greater resolution.

23 Claims, 3 Drawing Sheets

PHASE LOCK LOOP FREQUENCY CORRECTION CIRCUIT

FIELD OF THE INVENTION

This invention relates generally to a frequency correction circuit, and more particularly to frequency correction circuits in a phase lock loop circuit.

BACKGROUND OF THE INVENTION

In some digital audio implementations, a user must recover a clock of a complex input signal, such as digital audio data, so that the input signal may be correctly processed during subsequent operations. Generally, a phase lock loop circuit is used to determine the frequency of the clock. When a phase lock loop circuit is used, a reference clock that approximates the clock frequency of the input signal is provided to the phase lock loop circuit. The phase lock loop circuit then uses an iterative process in which the clock frequency of the input signal is compared with a reference frequency. By comparing the unknown clock frequency to a reference frequency, the reference frequency may be adjusted to more closely approximate the unknown clock frequency.

In a typical phase lock loop circuit, an incoming signal is provided to a phase detector such that the frequency of the incoming signal may be approximated. In the phase detector, the frequency of the incoming signal is compared with a reference frequency to produce a relative phase signal. The relative phase signal output by the phase detector is subsequently provided to a filter to provide a smoothly varying control output from the intermittent adjustments to the relative phase signal. The filtered signal is provided as an input to a voltage controlled oscillator (VCO). The VCO then uses the output of the phase lock loop circuit to adjust the reference frequency to more closely approximate the unknown clock frequency of the input signal. The process is performed iteratively such that the VCO may more closely approximate the unknown clock frequency with each successive iteration.

Although phase lock loop circuits generally perform well in most digital audio implementations, several limitations do exist. For example, when the input signal is a complex data stream without a perfectly periodic signal, the phase lock loop circuit is generally not able to lock to the frequency of the data stream. A complex data stream may be a digital audio data stream which is transmitted in a standard format such as AES-EBU or CP-340. The AES-EBU and CP-340 formats include preambles, digital audio data and digital non-audio data which do not allow the phase lock loop circuit to easily find a periodic edge to lock to.

When receiving such complex data streams, a "pre-processing" circuit must be provided to receive and process the data stream before it is input to the phase lock loop circuit. The pre-processing circuit is implemented to isolate a periodic edge within the complex data stream. Subsequently, the periodic edge is provided as control to enable the phase lock loop circuit to be able to lock to the frequency of the input signal. Pre-processing is, therefore, required to recover a reference frequency clock signal with little jitter.

Additionally, for the pre-processing circuit to function correctly, a reference frequency provided for comparison by the voltage controlled oscillator must be within a relatively close range of the clock signal of the complex data stream. If the reference frequency is not within a close range of the clock signal of the complex data stream, the pre-processing system is not able to work correctly. Therefore, the recovered clock signal will typically have too much jitter and will not provide the phase lock loop circuit with a usable input signal. Additionally, when the reference frequency provided by the voltage controlled oscillator is within a close range of the clock signal, the voltage controlled oscillator is designed to operate at only one sampling frequency. To operate at a wider range of sampling frequencies, a plurality of phase lock loop circuits would be required wherein each of the plurality of phase lock loop circuits has a voltage controlled oscillator designed to detect one of a plurality of sampling frequencies. The circuitry required to implement such a system would be too expensive and require too much circuit area to implement in most communications systems.

SUMMARY OF THE INVENTION

The previously mentioned needs are fulfilled with the present invention. Accordingly, there is provided, in one form, a phase lock loop circuit. The phase lock loop circuit includes a frequency discriminator which has a first input for receiving an external input signal having a plurality of input pulses at a first frequency. The frequency discriminator has a second input for receiving a reference signal having a plurality of reference pulses at a second frequency. The second frequency is higher than the first frequency. The frequency discriminator counts a number of the plurality of pulses of the reference signal which occur during a predetermined one of the plurality of pulses of the external input signal to provide a relative frequency count. A coarse frequency control circuit is coupled to the frequency discriminator for receiving the relative frequency count. The coarse frequency control circuit compares the relative frequency count to at least one predetermined threshold value to provide a coarse frequency control signal at a first output and a frequency control selector signal at a second output. The phase lock loop also includes a phase discriminator which has a first input for receiving the external input signal at the first frequency. The phase discriminator has a second input for receiving the reference signal at a third frequency. The phase discriminator compares the first frequency of the external input signal to the third frequency of the reference signal to provide a fine frequency control signal. A multiplexor has a first input coupled to the coarse frequency control circuit for receiving the coarse frequency control signal. The multiplexor also has a second input coupled to the phase discriminator for receiving the fine frequency control signal and a third input for receiving the frequency control selector signal. The multiplexor provides either the coarse frequency control signal or the fine frequency control signal as a control output signal in response the frequency control selector signal. A voltage controlled oscillator is coupled to the multiplexor for receiving the control output signal. The voltage controlled oscillator provides the reference frequency signal in response to the control output signal.

These and other features, and advantages, will be more clearly understood from the following detailed description taken in conjunction with the accompanying drawing.

DETAILED DESCRIPTION OF A PREFERRED EMBODIMENT

During a description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

The present invention provides a phase lock loop frequency correction circuit. The frequency correction circuit provides a reference frequency which closely approximates a multiple of an unknown frequency of an input signal using both a coarse and fine adjustment operation. The invention locks quickly over a relatively large range of frequencies to provide an output frequency in a timely manner and with a low amount of jitter. Additionally, the coarse adjustment operation allows the invention described herein to detect a range of frequencies of a complex input signal which a voltage controlled oscillator may then use to provide a reference frequency. Therefore, a pre-processing step may be correctly performed to identify the frequency of the input signal with the phase lock loop frequency correction circuit.

Figure 1:
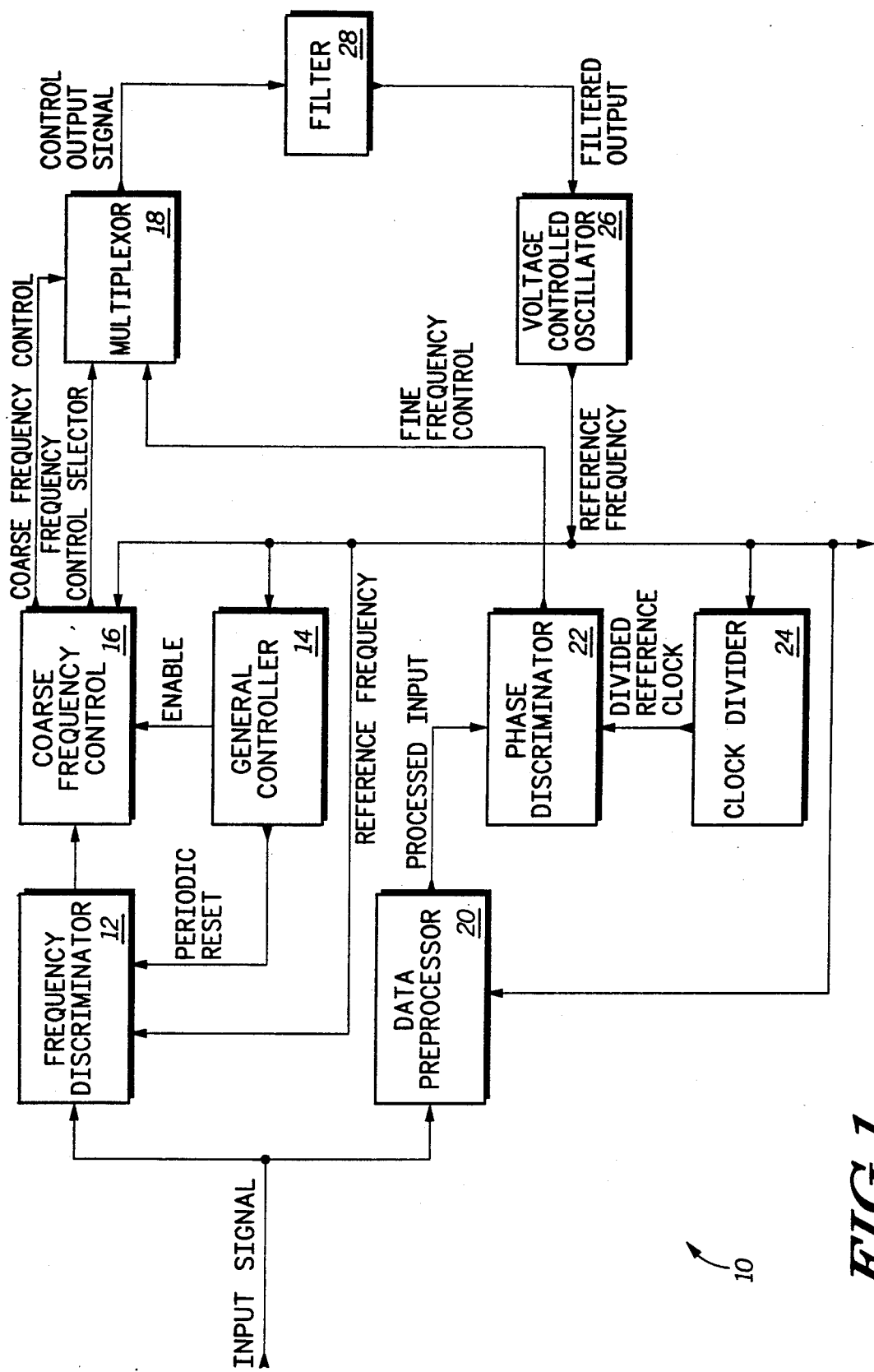
FIG. 1 illustrates in a block diagram form a phase lock loop frequency correction circuit in accordance with the present invention.

One implementation of the invention is illustrated in FIG. 1. FIG. 1 provides a phase lock loop circuit 10 which generally includes a frequency discriminator 12, a general controller 14, a coarse frequency control circuit 16, a multiplexor 18, an data preprocessor 20, a phase discriminator 22, a clock divider 24, a voltage controlled oscillator 26, and a filter 28.

An Input signal is provided to a first input of each of frequency discriminator 12 and data preprocessor 20. An output of frequency discriminator 12 is connected to coarse frequency control circuit 16. General Controller 14 is connected to frequency discriminator 12 to provide a "Periodic Reset" signal. Additionally, general controller 14 is connected to coarse frequency control circuit 16 to provide a signal labeled "Enable." A first output of coarse frequency control circuit 16 is connected to a first data input of multiplexor 18 to provide a Coarse Frequency Control signal. A second output of coarse frequency control circuit 16 is connected to a control input of multiplexor 18 to provide a Frequency Control Selector signal. An output of multiplexor 18 is connected to an input of filter 28 to provide a signal labeled "Control Output Signal."

Filter 28 is connected to voltage controlled oscillator 26 to provide a signal labeled "Filtered Output." Voltage controlled oscillator 26 is connected to each of frequency discriminator 12, coarse frequency control circuit 16, general controller 14, data preprocessor 20, phase discriminator 22, and clock divider 24 to provide a Reference Frequency signal. Additionally, the Reference Frequency signal is provided to an external user of phase lock loop circuit 10. Clock divider 24 is connected to phase discriminator 22 to provide a Divided Reference Clock signal. Additionally, data preprocessor 20 is connected to phase discriminator 22 to provide a Processed Input signal. Phase discriminator 22 is connected to a second data input of multiplexor 18 to provide a Fine Frequency Control signal.

During operation, phase lock loop circuit 10 compares the Input Signal with the Reference Frequency signal to determine whether voltage controlled oscillator 26 should increase, decrease, or not alter a frequency of the Reference Frequency signal. Control of voltage controlled oscillator 26 is performed in two steps. In a first step, a coarse control of voltage controlled oscillator 26 is provided to adjust the Reference Frequency signal to be within a range of frequencies which approximate a multiple of the frequency of the Input Signal. In a second step, a fine control of voltage controlled oscillator 26 is used to provide a more accurate approximation of the frequency of the Input Signal. By using two different steps in which a coarse approximation and then a fine approximation is performed, phase lock loop circuit 10 is able to lock to a wider range of frequencies of the Input Signal more quickly. The coarse approximation operation allows a user of phase lock loop circuit 10 to correctly lock to a wide range of sample rates by approximating the frequency of the Input Signal. The approximation allows voltage controlled oscillator 26 to provide a Reference Frequency signal within a range of frequencies which allow the Input Signal to be correctly processed by data preprocessor 20. If the Reference Frequency signal were not within the range of frequencies which allow the Input Signal to be correctly processed by data preprocessor 20, the Processed Input provided by data preprocessor 20 would have a high level of jitter and would not be readily usable in a remaining portion of phase lock loop circuit 10.

Figure 2:
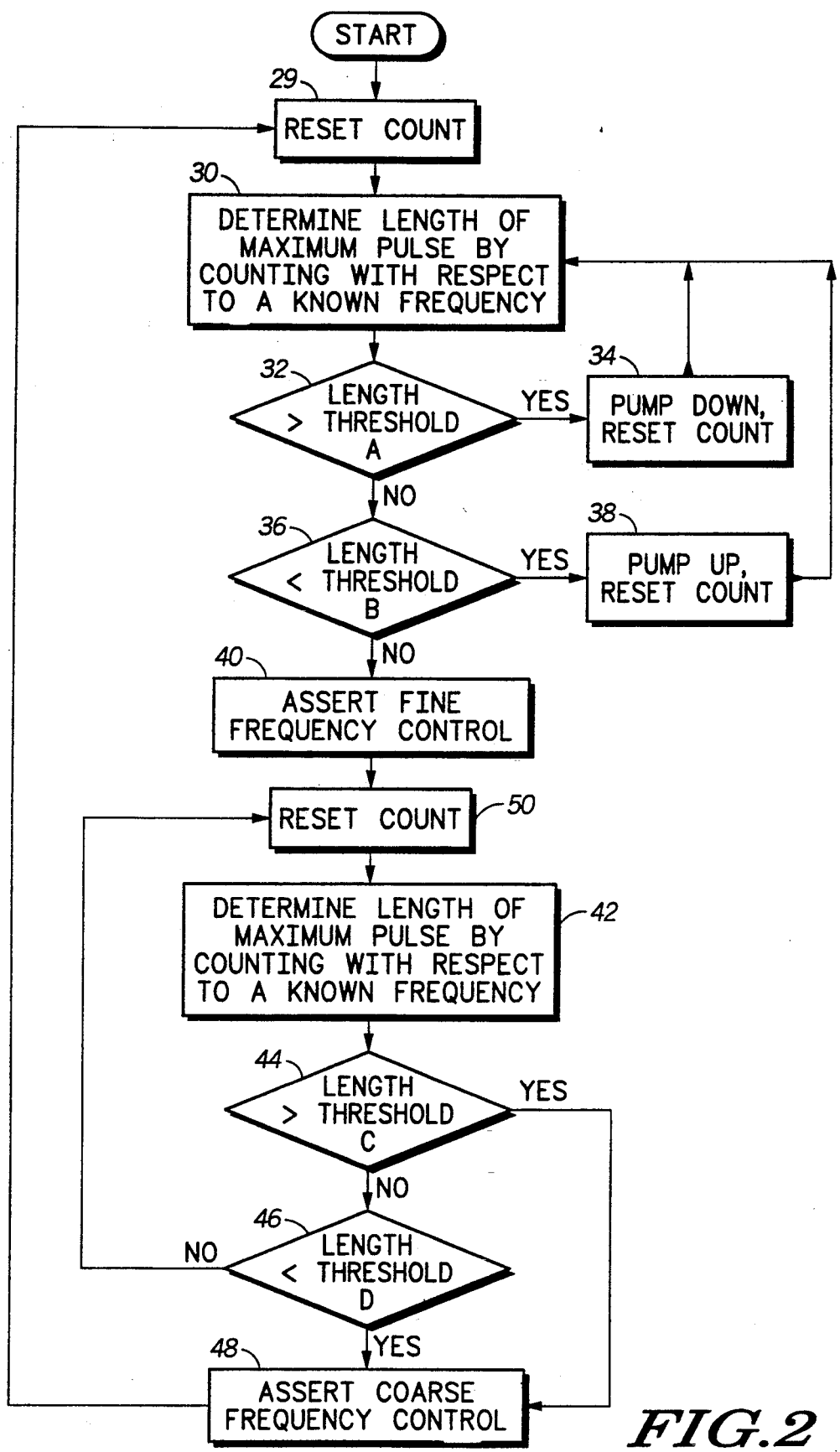
FIG. 2 illustrates in a flow chart form a plurality of functions performed by the frequency detector of FIG. 1.

A flowchart illustrating the steps for performing both the coarse and fine controls of voltage controlled oscillator 26 is illustrated in FIG. 2. In FIG. 2, a count value is reset to an initialized state in step 29. The count value is used to compare a number of pulses of the Reference Frequency signal in one of the Input Signal pulses. In step 30, a length of a maximum pulse of the Input signal is determined by comparing a number of pulses of the Reference Frequency signal which occur during each pulse of a series of pulses of the Input Signal. The series of pulses is examined for approximately a subframe to determine when the maximum pulse is asserted. The maximum pulse is identified by having a greater number of pulses of the Reference Frequency signal than any of the other pulses in the series of pulses of the Input Signal. A length of the maximum pulse is the count of the number of pulses of the Reference Frequency signal. General controller 14 performs step 29 and frequency discriminator 12 performs step 30.

The length of the maximum pulse is compared with a first threshold value labeled "Threshold A" in step 32. Step 32 is performed by coarse frequency control circuit 16. If the length of the maximum pulse is greater than the Threshold A value, the frequency of the Reference Frequency signal is too fast and should be slowed down. Therefore, in step 34, a control signal is provided which indicates that voltage controlled oscillator 26 should slow down, or pump down, the frequency of the Reference Frequency signal. In the implementation of the invention described herein, the control signal is the Coarse Frequency Control signal. Additionally, if the length of the maximum pulse is greater than the Threshold A value, the count is reset to an initialized state. Subsequently, the length of the maximum pulse of the Input signal is again measured with reference to the Reference Frequency signal to determine if the frequency of the Reference Frequency signal should be increased, decreased, or not altered.

If the length of the maximum pulse is not greater than the Threshold A value, the length of the maximum pulse is compared with a second threshold value labeled "Threshold B" in step 36. Like step 32, step 36 is performed by coarse frequency control circuit 16. If the length of the maximum pulse is less than the Threshold B value, the frequency of the Reference Frequency signal is too slow and should be increased. Therefore, in step 38, the Coarse Frequency Control indicates that voltage controlled oscillator 26 should be "pumped up" to increase the frequency of the Reference Frequency signal. Additionally, if the length of the maximum pulse is less than the Threshold B value, the count is reset to an initialized state. Subsequently, the length of the maximum pulse of the Input signal is again measured with reference to the Reference Frequency signal to determine if the frequency of the Reference Frequency signal should be further modified.

If the length of the maximum pulse of the Input Signal is not greater than the Threshold A value and is not less than the Threshold B value, then the frequency of the Reference Frequency signal is within the fine frequency control range. Therefore, control necessary to adjust the Reference Frequency according to the fine control specifications is provided next in step 40. The control is provided via the Frequency Control Selector signal. The Frequency Control Selector signal enables multiplexor 18 to provide control for voltage controlled oscillator 26 from either coarse frequency control circuit 16 or phase discriminator 22.

Before execution of the fine frequency control operation, the count of the maximum pulse of the Input Signal is reset in step 50. Additionally, during the fine adjustment of the Reference Frequency signal, the length of the maximum pulse of the Input Signal is again determined in step 42. Again, determination of the length of the maximum pulse of the Input signal is performed by frequency discriminator 12.

In step 44, the length of the maximum pulse of the Input Signal is compared with a third threshold value labeled "Threshold C." As with steps 32, 34, 36, and 38, step 44 is performed by coarse frequency control circuit 16. If the length of the maximum pulse is greater than the Threshold C value, the frequency of the Reference Frequency signal is out of the range for fine adjustment and should be adjusted according to the coarse frequency control specifications, rather than the fine frequency control performed by phase discriminator 22. Therefore, coarse frequency control 16 is enabled to provide the Frequency Control Selector signal to multiplexor 18 such that the Coarse Frequency Control signal is provided to control adjustment of voltage controlled oscillator 26. This operation is illustrated in step 48 of FIG. 2.

If the length of the maximum pulse of the Input Signal is not greater than the Threshold C value, the length is compared to a fourth threshold value labeled "Threshold D" in step 46. If the length of the maximum pulse of the Input Signal is less than the Threshold D value, the frequency of the Reference Frequency signal is out of the range for fine adjustment and should be adjusted according to the coarse frequency control specifications. Therefore, the control necessary to perform the coarse frequency adjustment is asserted and the count of the length of the maximum pulse is reset to an initialization value. The operation described above is illustrated in step 48 of the flowchart illustrated in FIG. 2.

As shown in steps 44 and 46 of FIG. 2, if the length of the maximum pulse of the Input Signal is not greater than the Threshold C value and not less than the Threshold D value, the frequency should continue to be adjusted according to the fine adjustment specification. The fine adjustment specification is performed by phase discriminator 22. Phase discriminator 22 is implemented as a Type IV phase detector in this embodiment of the invention. Type IV phase detectors are well known in the data processing art and, therefore, will not be discussed in more detail herein.

To enable phase discriminator 22 to perform the fine adjustment, data preprocessor 20 and clock divider 24 respectively provide the Processed Input signal and the Divided Reference Clock signal to phase discriminator 22. The Processed Input signal is compared with the Divided Reference Clock signal to provide an accurate Fine Frequency Control signal. The Divided Reference Clock signal is provided via clock divider 24. Clock divider 24 divides the Reference Frequency signal to more closely approximate the frequency of the Input Signal.

Optional Data preprocessor 20 may be used to isolate a periodic edge of a first signal. In the implementation of the invention described herein, data preprocessor 20 is used to detect a penultimate edge just preceding the trailing edge of the preamble. The trailing edge is then provided to phase discriminator 22 for subsequent operations. The operation performed by data preprocessor 20 is illustrated in flow chart form in FIG. 3.

Figure 3:
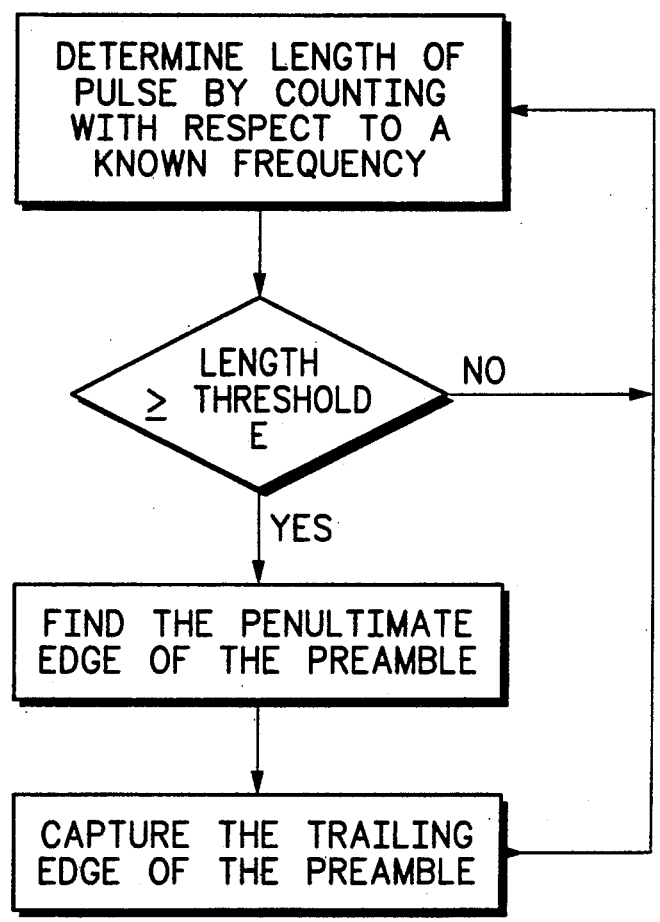
FIG. 3 illustrates in a flow chart form a function performed by a data preprocessor of FIG. 1.

In FIG. 3, a length of a pulse of the Input Signal is measured with respect to the frequency of the Reference Frequency signal. The measurement of the length of the Input Signal is performed continuously until the length of the pulse is equal to a fifth threshold value labeled "Threshold E." The Threshold E value is generally some number less than the number which indicates that the pulse is the maximum length. For example, in the implementation of the invention described herein, assume the maximum pulse has a triple-width which is approximately equal to twelve pulses of the Reference Frequency signal. Similarly, a double-width pulse would be approximately equal to eight pulses of the Reference Frequency signal. The Threshold E value might be equal to ten pulses of the Reference Frequency signal to indicate that a pulse in the Input Signal is longer than the double-width and, therefore, must be a triple width pulse. It is assumed that the pulse is a triple-width pulse because in the example described herein, only single, double, and triple width pulses are allowed.

In the example described herein, the Input Signal is assumed to be a data stream compatible with an AES-EBU or a CP-340 digital data format. In such a data stream, a preamble occurs periodically. As was previously mentioned, triple width pulses only occur in the preamble. However, three different types of formats exist. Therefore, after an initial triple width pulse, succeeding pulse widths in the preamble will vary from one preamble to the next. Fortunately, all preambles have the same number of rising or falling edges. Therefore, once the Threshold E value is detected, finding the penultimate edge of the preamble is only a matter of counting rising or falling edges.

If the pulse is not greater than or equal to the Threshold E value, the pulse of the Input Signal is again measured to determine a length. If the pulse is greater than or equal to the Threshold E value, a number of edges is counted to find a penultimate edge of the preamble. Upon detection of the penultimate edge, a next edge of the Input Signal after the penultimate edge is provided to phase discriminator 22 as the Processed Input signal. Operation of phase discriminator 22 will later be discussed in further detail.

During operation, phase lock loop circuit 10 executes each of the functions described in the flowchart of FIG. 2 and the flowchart of FIG. 3. Phase lock loop circuit 10 receives the Input signal at a first sampling frequency. Additionally, frequency discriminator 12 and coarse frequency control circuit 16 of this embodiment of the invention function most effectively with input signals which meet the following criteria:
1. The input signal is a digital signal consisting of a finite set of finite-length pulse widths;
2. At least one of these pulses will occur at a regular interval (i.e. be periodic); and
3. The reference frequency is higher than the unknown clock frequency.

Criterion (1) is further defined by clarifying that the time between all transition of the input signal are a member of the set {w1, w2, ... wn}, where n is a finite integer and w1 through wn are finite numbers. An example of such a signal is a Manchester modulated data value in which two possible pulse widths are recognized. The two possible pulse widths are a single and a double pulse width. Another example of such a signal is a signal which is transmitted in the AES3-1985 digital audio standard which is encoded in a Manchester biphase mark with synchronization pattern. In the AES3-1985 standard, a Manchester encoded signal may have three pulse widths. The three pulse widths are the single, the double, and the triple.

In the implementation of the invention described herein, data preprocessor 20 of phase lock loop circuit 10 determines a periodic edge of the Input signal such that the frequency of the Input signal may be more quickly determined. Because the Input Signal is in a standard format such as AES-EBU or CP-340, a last edge of a preamble is a convenient periodic edge to determine. Additionally, preambles are easily distinguishable from other data because a preamble always has a triple width pulse. Other data only has double and single width pulses.

Therefore, to determine a periodic edge, general controller 14 provides the Periodic Reset signal to frequency discriminator 12. The Periodic Reset signal initializes a counter (not shown) in frequency discriminator 12 to a value of zero. When the Input Signal is provided to frequency discriminator 12, a length of a maximum pulse of the Input signal is determined by comparing a number of pulses of the Reference Frequency signal which occur during each pulse of a series of pulses of the Input Signal. The series of pulses is counted for approximately a subframe period to determine a length of the maximum pulse which occurs during this approximate subframe period. The maximum pulse is identified by having a greater number of pulses of the Reference Frequency signal than any of the other pulses is the serial of pulses of the Input Signal. A length of the maximum pulse is the count of the number of pulses of the Reference Frequency signal. Because the maximum pulse width of the Input Signal occurs when a preamble is transferred, the maximum pulse width occurs at regular intervals and may be considered a reliable indicator of the frequency of the Input Signal. In other implementations, the minimum pulse width or the most frequent pulse width may also be used to determine the frequency of the Input Signal.

An output of frequency discriminator 12 is a count of a number of pulses of the Reference Frequency signal which are provided during a maximum pulse of the Input signal. The count is a relative frequency representation based on the Reference Frequency signal. As an example, assume that the frequency of the Reference Frequency signal samples a single width pulse of the Input Signal four times. This is typically referred to as four times oversampling. Therefore, the Reference Frequency signal is always higher than the frequency of the Input Signal. When the reference frequency is close to the frequency of the Input Signal and the Input Signal has either a single-width, double-width, or triple-width pulse, the longest maximum length of a pulse of the Input signal is equal to twelve pulses of the Reference Frequency signal. Therefore, the maximum length of a pulse width of the Input signals, in a count of Reference Frequency signal pulses, is equal to twelve. In FIG. 2, the operation described above is illustrated in Steps 29 and 30.

The count is output by frequency discriminator 12 to coarse frequency control circuit 16. Coarse frequency control circuit 16 uses the relative frequency representation output by frequency discriminator 12 to provide both the Coarse Frequency Control signal and the Frequency Control Selector signal. When enabled by general controller 14, coarse frequency control circuit 16 compares the count output by frequency discriminator 12 to the first threshold value referred to as "Threshold A." If the count is greater than the Threshold A value, coarse frequency control circuit 16 provides the Coarse Frequency Control signal to indicate that the frequency of the Reference Frequency signal should be decreased, or pumped down, to more closely approximate a multiple of the frequency of the Input signal. The operation described above is illustrated in Steps 32 and 34 of FIG. 2.

If the count is not greater than the Threshold A value, the count is compared to the second threshold value referred to as "Threshold B." If the count is less than the Threshold B value, coarse frequency control circuit 16 provides the Coarse Frequency Control signal to indicate that the frequency of the Reference Frequency signal should be increased, or pumped up, to more closely approximate a multiple of the frequency of the Input signal. The operation described above is illustrated in Steps 36 and 38 of FIG. 2.

If the count is not greater than the Threshold A value and is not less than the Threshold B value, then coarse frequency control circuit 16 determines that the frequency of the Reference Frequency signal is within a close range of the frequency of the Input Signal. Therefore, the Fine Frequency Control signal is asserted to indicate that the frequency of the Input Signal may be determined more precisely with phase discriminator 22. This step is illustrated as Step 40 in FIG. 2.

Phase discriminator 22 provides the Fine Frequency Control signal in response to each of the Processing Input signal and the Divided Reference Clock signal. As was previously described, the Divided Reference Clock signal is provided via clock divider 24. Clock divider 24 divides the Reference Frequency signal to approximate a multiple of the frequency of the Input Signal. Additionally, the Processing Input signal is provided via data preprocessor 20. Optional data preprocessor 20 is used to isolate the penultimate edge of the Input Signal just preceding the trailing edge of the preamble.

In phase lock loop circuit 10, frequency discriminator 22, clock divider 24, and data preprocessor 20 collectively form a phase detector. Similarly, a frequency detector is formed by frequency discriminator 12, general controller 14, and coarse frequency control circuit 16. The operations performed by the frequency detector and the phase detector are performed concurrently to respectively provide each of the Coarse Frequency Control and Fine Frequency Control signals to multiplexor 18.

In addition to the Coarse Frequency Control signal, coarse frequency control circuit 16 provides the Frequency Control Selector signal to multiplexor 18. The Frequency Control Selector is asserted or negated by coarse frequency control circuit 16 to select between either the Coarse Frequency Control or the Fine Frequency Control signal. The Frequency Control Selector signal enables multiplexor 18 to choose either the Coarse Frequency Control signal or the Fine Frequency Control signal as the Control Output Signal which controls operation of voltage controlled oscillator 26.

As was previously described, the Frequency Control Selector signal selects the Coarse Frequency Control signal as the Control Output Signal when the frequency of the Reference Frequency signal is not within a predetermined range of the frequency of the Input Signal. When the frequency of the Reference Frequency signal is within the predetermined range, the Frequency Control Selector signal selects the Fine Frequency Control signal as the Control Output Signal. The Fine Frequency Control signal enables voltage controlled oscillator 26 to adjust the frequency of the Reference Frequency signal more finely.

Whether the Coarse Frequency Control or the Fine Frequency Control signal is asserted, multiplexor 18 provides one as the Control Output Signal. The Control Output Signal is subsequently provided to filter 28. Filter 28 filters the Control Output Signal to provide a smoothly varying Filtered Output signal. The Filtered Output signal to voltage controlled oscillator 26. Voltage controlled oscillator 26 adjusts a frequency of the Reference Frequency signal in accordance with the Filtered Output signal. Additionally, the Reference Frequency signal is provided to an external user of phase lock loop circuit 10.

Phase lock loop circuit 10 performs each of the functions described above iteratively to lock to the frequency of the Input Signal both accurately and quickly. Additionally, phase lock loop circuit 10 is able to lock to a wide range of frequencies of a complex input signal such as an AES-EBU or CP-340 encoded digital audio data stream. The coarse frequency adjustment steps executed in accordance with the flowchart of FIG. 2 enable voltage controlled oscillator 26 of phase lock loop circuit 10 to more closely approximate the frequency of the Input Signal using a maximum pulse width measurement. If the approximated frequency was not within a close range of a multiple of the frequency of the Input signal, lengths of each of the single, double, and triple pulse widths would be difficult to distinguish from one another because the length of even the single pulse width would be unknown. However, the coarse frequency adjustment steps allow voltage controlled oscillator to quickly approximate a multiple of the frequency of the Input Signal and to provide that approximation via the Reference Frequency signal. Data preprocessor 20 is able to use the Reference Frequency signal to capture the periodic edge of the Input signal correctly. If the Reference Frequency had not been within a close range of a multiple of the frequency of the Input Signal, data preprocessor 20 would not have been able to correctly capture the periodic edge of the Input signal. Subsequently, data preprocessor 20 would have provided phase discriminator 22 with a Processed Input signal with a high level of jitter and phase discriminator 22 would not be able to provide a correct Fine Frequency Control signal to control operation of voltage controlled oscillator 26.

The maximum pulse width measurement is also used during the fine adjustment steps collectively executed by data preprocessor 20, phase discriminator 22, and clock divider 24. By detecting the maximum pulse width, an edge of a data value may be accurately captured to insure that phase discriminator 22 operates correctly.

The phase lock loop frequency correction circuit described herein is able to lock to a frequency of a complex input signal without added external circuitry. The implementation of the invention described herein is provided by way of example only, however, and many other implementations may exist for executing the function described herein. For example, rather than detecting a maximum pulse width, a minimum or most frequency pulse width might also be detected. Additionally, phase discriminator 22 is a phase detector circuit which is well known in the art and, therefore, may have multiple implementations. In some embodiments, filter 28 may not be used during operation of phase lock loop circuit 10. Data preprocessor 20 and Clock divider 24 may also be removed in some implementations of the invention described herein. Additionally, while the Coarse Frequency Control signal is implemented as a single signal in this embodiment of the invention, a plurality of signals may be implemented to perform a similar function. Similarly, the Fine Frequency Control signal may be implemented as a plurality of signals to perform an analogous function. Additionally, while the flow chart illustrated in FIG. 2 illustrates the steps executed during the coarse and fine frequency adjustment operations sequentially, the comparisons between the length of the maximum pulse and the Threshold A value and the Threshold B value may be executed concurrently. In other words, in FIG. 2, steps 32 and 36 may be executed concurrently in some embodiments of the invention described herein. As well, while the flow chart illustrated in FIG. 2 illustrates the steps executed during the coarse and fine frequency adjustment operations sequentially, the comparisons between the length of the maximum pulse and the Threshold C value and the Threshold D value may be executed concurrently. In other words, in FIG. 2, steps 44 and 46 may be executed concurrently in some embodiments of the invention described herein.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. A phase lock loop circuit, comprising:
   a frequency discriminator having a first input for receiving an external input signal having a plurality of input pulses at a first frequency, the frequency discriminator having a second input for receiving a reference signal having a plurality of reference pulses at a second frequency, wherein the second frequency is higher than the first frequency, the frequency discriminator counting a number of the plurality of pulses of the reference signal which occur during a predetermined one of the plurality of pulses of the external input signal to provide a relative frequency count;
   a coarse frequency control circuit coupled to the frequency discriminator for receiving the relative frequency count, the coarse frequency control circuit comparing the relative frequency count to at least one predetermined threshold value to provide a coarse frequency control signal at a first output and a frequency control selector signal at a second output;
   a phase discriminator having a first input for receiving the external input signal at the first frequency, the phase discriminator having a second input for receiving the reference signal at a third frequency, the phase discriminator comparing the first frequency of the external input signal to the third frequency of the reference signal to provide a fine frequency control signal;
   a multiplexor having a first input coupled to the coarse frequency control circuit for receiving the coarse frequency control signal, a second input coupled to the phase discriminator for receiving the fine frequency control signal, and a third input for receiving the frequency control selector signal, the multiplexor providing either the coarse frequency control signal or the fine frequency control signal as a control output signal in response the frequency control selector signal; and
   a voltage controlled oscillator coupled to the multiplexor for receiving the control output signal, the voltage controlled oscillator providing the reference frequency signal in response to the control output signal.

2. The phase lock loop circuit of claim 1 further comprising:
   a data preprocessor for receiving the external input signal, the data preprocessor coupled to the voltage controlled oscillator for receiving the reference signal at the second frequency, the data preprocessor using the reference signal to isolate a predetermined edge of a pulse following the one of the predetermined pulses of the external input signal to provide a processed input signal to the phase discriminator.

3. The phase lock loop circuit of claim 1 wherein the third frequency is derived from the second frequency.

4. The phase lock loop circuit of claim 1 wherein the predetermined one of the plurality of input pulses of the external input signal is a pulse having a maximum pulse width.

5. The phase lock loop circuit of claim 1 wherein the external input signal is comprises of a finite set of finite-length pulses, wherein at least one of the finite set of finite-length pulses will occur at a regular interval.

6. The phase lock loop circuit of claim 1 wherein the external input signal is comprised of a plurality of digital audio data values in a format compatible with either an AES-EBU format or a CP-340 format.

7. The phase lock loop circuit of claim 6 wherein the predetermined one of the pulses of the external input signal is included in a preamble of a subframe of the plurality of digital audio data values.

8. The phase lock loop circuit of claim 1 wherein the frequency control selector signal indicates whether the frequency of the reference signal is within a coarse or a fine frequency range of the frequency of the external input signal, each of the coarse and fine frequency ranges being defined by at least one predetermined threshold value.

9. The phase lock loop circuit of claim 1 wherein the control output signal indicates whether the frequency of the reference signal should be increased or decreased.

10. A method for operating a phase lock loop circuit, comprising the steps of:
    receiving an input signal having a plurality of input pulses at a first frequency;
    receiving a reference signal having a plurality of reference pulses at a second frequency, wherein the second frequency is higher than the first frequency;
    counting a number of the plurality of reference pulses of the reference signal which occurs during a predetermined one of the plurality of input pulses, the number being provided as a relative frequency count;
    comparing the relative frequency count to a first predetermined threshold value to provide a coarse frequency control signal and a frequency control selector signal;
    comparing the first frequency of the input signal to a third frequency derived from the second frequency of the reference signal to provide a fine frequency control signal;
    selecting either the coarse frequency control signal or the fine frequency control signal as a control output signal in response to the frequency control selector signal; and
    adjusting the frequency of the reference signal in response to the control output signal.

11. The method of claim 10 further comprising the steps of:
    isolating a predetermined edge of a pulse following the predetermined one of the plurality of input pulses to provide a processed input signal; and
    providing the processed input signal, in place of the input signal, to generate the fine frequency control signal.

12. The method of claim 11 wherein the step of isolating the predetermined edge is further comprising the steps of:
    comparing the relative frequency count to a second predetermined threshold value;
    continuing to compare the relative frequency count to the second predetermined threshold value if the relative frequency count is less than the second predetermined threshold value;

finding a penultimate edge of a predetermined portion of the input signal if the relative frequency count is greater than or equal to the second predetermined threshold value; and providing a next edge of the input signal as the predetermined edge.

13. The method of claim 10 wherein the predetermined one of the plurality of input pulses is a pulse having a maximum pulse width.

14. The method of claim 10 wherein the input signal is comprised of a finite set of finite-length pulses, wherein at least one of the finite set of finite-length pulses will occur at a regular interval.

15. The method of claim 10 wherein the input signal is a plurality of digital audio data values in a format compatible with either an AES-EBU format or a CP-340 format.

16. The method of claim 15 wherein the predetermined one of the input pulses is included in a preamble of a subframe of the plurality of digital audio data values.

17. The method of claim 10 wherein the frequency control selector signal indicates whether the frequency of the reference signal is within a coarse or a fine frequency range of the frequency of the external input signal, each of the coarse and fine frequency ranges being defined by at least one predetermined threshold value.

18. The method of claim 10 wherein the control output signal indicates whether the frequency of the reference signal should be increased or decreased.

19. A phase lock loop circuit, comprising:
a frequency discriminator having a first input for receiving an external input signal, a second input for receiving a reference frequency signal, and an output for providing a relative frequency count;
a coarse frequency control circuit coupled to the frequency discriminator, the coarse frequency control circuit having a first input for receiving the relative frequency count, a second input for receiving the reference frequency signal, a first output for providing a coarse frequency control signal and a second output for providing a frequency control selector signal;
a data preprocessor having a first input for receiving the external input signal, a second input for receiving the reference frequency signal, and an output for providing a processed signal;
a phase discriminator coupled to the data preprocessor, the phase discriminator having a first input for receiving the processed signal, a second input for receiving a divided signal, and an output for providing a fine frequency control signal;
a multiplexor having both a first input coupled to the coarse frequency control circuit for receiving the coarse frequency control signal, a second input coupled to the coarse frequency control circuit for receiving the frequency control selector signal, and a third input coupled to the phase discriminator for receiving the frequency control selector signal, the multiplexor having an output for providing a control output signal; and
a voltage controlled oscillator coupled to the multiplexor, the voltage controlled oscillator having an input for receiving the control output signal, the voltage controlled oscillator having an output for providing the reference frequency signal.

20. The phase lock loop circuit of claim 19 further comprising:
a filter having an input coupled to the multiplexor for receiving the control output signal and an output coupled to the voltage controlled oscillator for providing a filtered output signal.

21. The phase lock loop circuit of claim 19 further comprising:
a controller having an input coupled to the voltage controlled oscillator for receiving the reference frequency signal, a first output coupled to the frequency discriminator for providing a periodic reset signal, and a second output coupled to the coarse frequency control circuit for providing an enable signal.

22. The phase lock loop circuit of claim 19 wherein the output of voltage controlled oscillator is coupled to the second input of each of the frequency discriminator, the coarse frequency control circuit, and the data preprocessor.

23. The phase lock loop circuit of claim 19 further comprising:
a clock divider having an input coupled to the voltage controlled oscillator for receiving the reference frequency signal and an output coupled to the phase discriminator for providing the divided signal.

* * * * *